(12) United States Patent
Griswold et al.

(10) Patent No.: US 8,649,579 B2
(45) Date of Patent: Feb. 11, 2014

(54) MOTION ARTIFACT REMOVAL

(76) Inventors: Mark A. Griswold, Shaker Heights, OH (US); Candice Bookwalter, University Heights, OH (US); Nicole Seiberlich, Shaker Heights, OH (US); Vikas Gulani, Shaker Heights, OH (US)

( * ) Notice: Subject to any disclaimer, the term of this patent is extended or adjusted under 35 U.S.C. 154(b) by 800 days.

(21) Appl. No.: 12/817,520

(22) Filed: Jun. 17, 2010

(65) Prior Publication Data

US 2011/0311158 A1    Dec. 22, 2011

(51) Int. Cl.
*G06K 9/00* (2006.01)

(52) U.S. Cl.
USPC .......................................................... 382/128

(58) Field of Classification Search
None
See application file for complete search history.

(56) References Cited

U.S. PATENT DOCUMENTS 8,155,389 B2 *   4/2012   Parker et al. ................... 382/107
8,233,681 B2 *   7/2012   Aylward et al. ............... 382/128

* cited by examiner

*Primary Examiner* — Michelle L Le (57) ABSTRACT

Systems, methods, and other embodiments associated with removing motion artifacts from MR images are described. One example method includes controlling an MRI apparatus to acquire a fully sampled, centric-ordered, non-interleaved, data set from an object to be imaged and controlling a Generalized Auto-Calibrating Partially Parallel Acquisition (GRAPPA) logic to produce a GRAPPA duplicate of a single partition through the data set. The method also includes computing, from the GRAPPA duplicate, a GRAPPA navigator for a phase encoding (PE) line in the single partition and computing an error between the PE line in the single partition and a corresponding PE line in the GRAPPA duplicate using the GRAPPA navigator. The method also includes selectively replacing data in the PE line in the single partition with replacement data upon determining that the error exceeds a threshold. The method may include reconstructing an MR image based, at least in part, on the single partition.

17 Claims, 7 Drawing Sheets

MOTION ARTIFACT REMOVAL

BACKGROUND

Magnetic resonance (MR) images may be negatively impacted by artifacts (e.g., motion artifacts). Motion artifacts in MR images may appear as ghosting or streaking artifacts. The motion artifacts may obscure information in an MR image. Magnetic resonance imaging (MRI) of things that may move during imaging are susceptible to motion artifacts. For example, MR angiography, MR thoracic imaging, MR abdominal imaging, and so on, may be susceptible to motion artifacts due to breathing, heartbeats, and so on. Conventionally, and unfortunately, an information obscuring artifact may not be discovered until after an image is completely acquired. This is particularly hurtful when acquiring the MR image involved a timed contrast agent enhancement.

Conventional attempts to mitigate motion artifacts have included trying to acquire useful images in less time by, for example, using parallel imaging and fast pulse sequences. However, these attempts may have been defeated by motion. Conventionally it has been difficult, if possible at all, to mitigate the artifact effects and salvage a useable image. Therefore, improvements in artifact detection and mitigation are sought.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example systems and methods employ a centric-ordered, Volumetric Interpolated Breath-hold Examination (VIBE) sequence and a Generalized Auto-calibrating Partially Parallel Acquisition (GRAPPA) Navigator based automated motion detector to identify and manipulate k-space data that is corrupted by motion. The detector can operate on-the-fly or retrospectively to manipulate (e.g., remove) corrupted data. An MR image reconstructed from a data set that includes the data manipulated by the detector may have lower resolution than an image reconstructed from a complete data set. However, the image will be less impacted by motion artifacts.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 1:
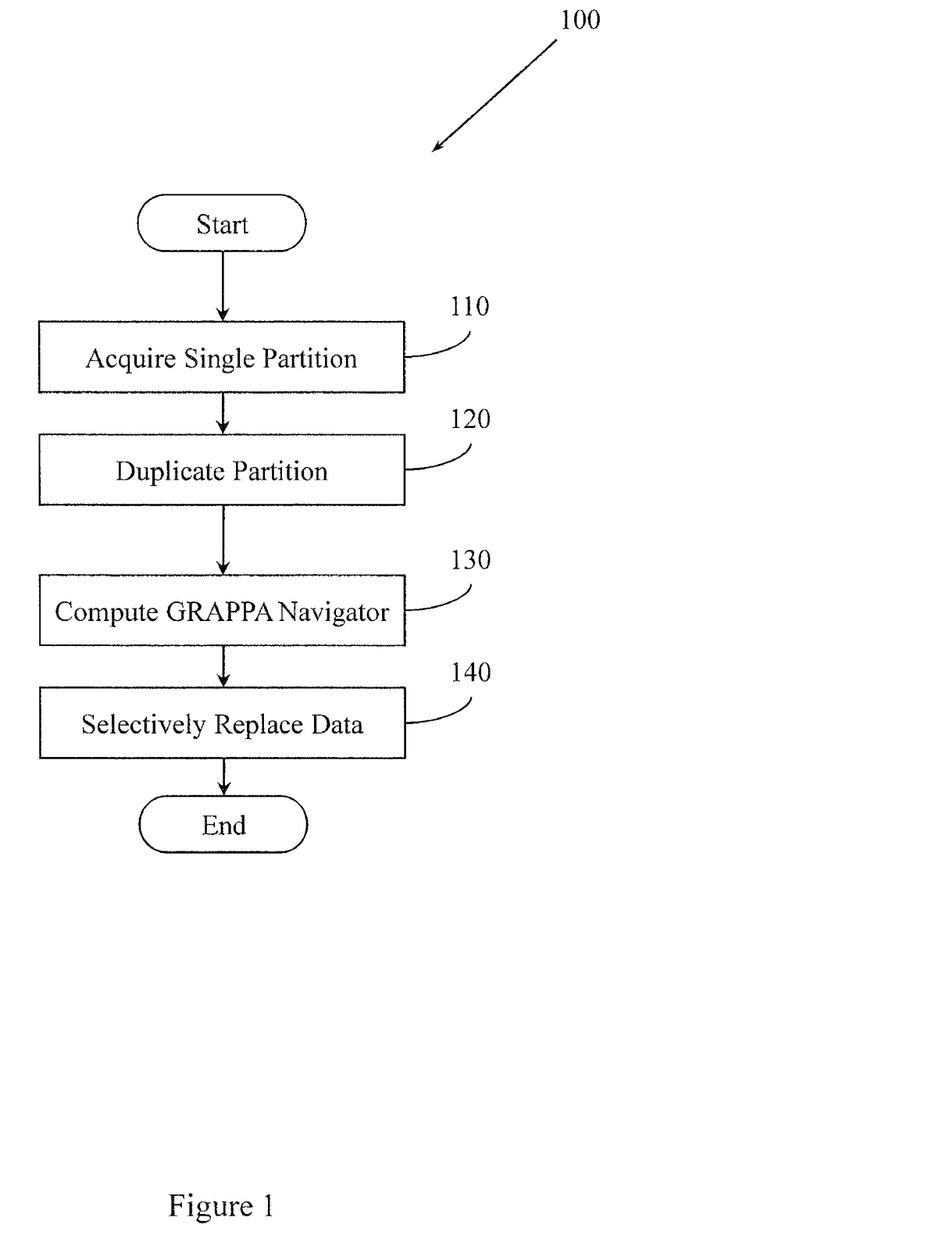
FIG. 1 illustrates an example method associated with motion artifact detection and removal.

FIG. 1 illustrates a method 100 associated with motion artifact detection and removal. Method 100 may include, at 110, controlling a magnetic resonance imaging (MRI) apparatus to acquire a fully sampled, centric ordered, non-interleaved, data set from an object to be imaged. One skilled in the art will appreciate that the data set may be acquired as part of a larger data set. Thus, while method 100 describes acquiring a data set, method 100 can more comprehensively include controlling the MRI apparatus to acquire a multi-coil three-dimensional data set, where the data set is part of the multi-coil three-dimensional data set.

The acquisition at 110 is performed after the object to be imaged has been subjected to MR processing. Thus, method 100 may also include controlling the MRI apparatus to apply a Volumetric Interpolated Breath-hold Examination (VIBE) sequence to the object to be imaged. The acquiring at 110 can therefore be performed in response to the VIBE sequence being applied to the object to be imaged. One skilled in the art will appreciate that the acquisition at 110 can also be performed in response to other pulse sequences being applied to an object to be imaged.

Method 100 may also include, at 120, controlling a Generalized Auto-Calibrating Partially Parallel Acquisition (GRAPPA) logic to produce a GRAPPA duplicate of a single partition through the data set. Method 100 may also include, at 130, computing, from the GRAPPA duplicate, a GRAPPA navigator for a phase encoding (PE) line in the single partition. One skilled in the art is familiar with GRAPPA and GRAPPA navigators.

Recall that while method 100 describes acquiring a data set and producing a single partition, method 100 can more comprehensively include controlling the MRI apparatus to acquire a multi-coil three-dimensional data set and that single partitions can be produced from smaller data sets that are part of the multi-coil three-dimensional data set. Therefore, more comprehensively, method 100 can include computing GRAPPA duplicates for many single partitions.

Method 100 may also include, at 140, selectively replacing data in the PE line in the single partition with replacement data upon determining that the PE line includes motion corrupted data. In one example the replacement data may be data corresponding to a zero signal from the object to be imaged. In another example the replacement data is zeroes. Replacing the motion corrupted data with zeroes or with other data that simulates no signal being received from the object to be imaged facilitates removing an artifact that would be produced by the motion corrupted data. While the resulting data set may be incomplete and thus yield a lower resolution image when reconstructed, a viable tradeoff between resolution and artifact removal may be exist.

Figure 7:
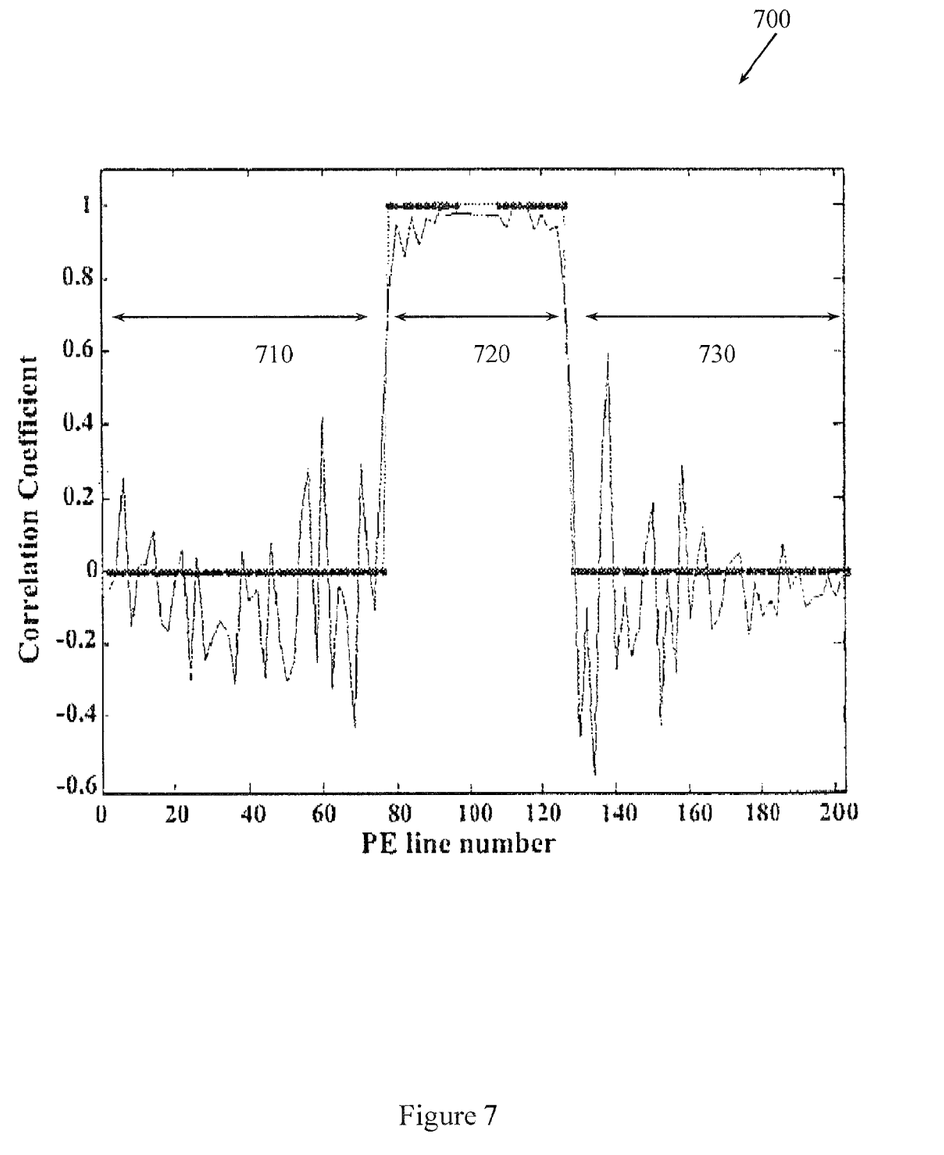
FIG. 7 illustrates a plot of correlation coefficients for PE lines for one partition and one coil.

The replacing at 140 may be performed in response to determining that a comparison of the PE line in the single partition and a corresponding PE line in the GRAPPA indicates that data in the PE line has been motion corrupted. The comparison may be based, at least in part, on the GRAPPA navigator. In one example, comparing the PE line in the single partition and the corresponding PE line in the duplicate may produce correlation coefficients that describe the relationship between the corresponding PE lines. The correlation coefficients may then be fit to different functions (e.g., step function, boxcar function) to determine whether motion corrupted data has been encountered. FIG. 7 illustrates a plot 700 where a boxcar function has been fit to correlation coefficients. The step discontinuity in plot 700 illustrates a point at which motion corrupted data has been detected.

While method 100 describes selectively replacing data in the PE line, other actions may be taken. For example, method 100 may include selectively replacing additional data in additional PE lines in the single partition as a function of determining that the error exceeds the threshold. For example, data in all PE lines acquired after a PE line that includes motion corrupted data may be replaced. In another example, data in additional related single partitions in the multi-coil three dimensional data set may be replaced. One skilled in the art will appreciate that method 100 may produce multiple candidate data sets from which an MR image can be reconstructed. The multiple candidate data sets may include different amounts of replacement data. One skilled in the art will appreciate that the data replacement can occur at different times.

In one example motion corrupted data may be replaced on-the-fly during an acquisition while in another example the motion corrupted data may be replaced after an MRI acquisition has completed. Since the motion corrupted data may be identified during an acquisition, in one example method 100 may include selectively terminating an MRI acquisition upon detecting motion corrupted data. After termination, the MRI acquisition may be restarted. In one example, method 100 facilitates automatically controlling an MRI session so that MRI acquisition continues until a desired amount of motion free data is acquired or until a limiting number of MRI acquisition attempts have failed to yield a motion free data.

While FIG. 1 illustrates various actions occurring in serial, it is to be appreciated that various actions illustrated in FIG. 1 could occur substantially in parallel. By way of illustration, a first process could control partition acquisition, a second process could control partition duplication, and a third process could control motion corrupted data detection. While three processes are described, it is to be appreciated that a greater and/or lesser number of processes could be employed and that lightweight processes, regular processes, threads, and other approaches could be employed.

Figure 2:
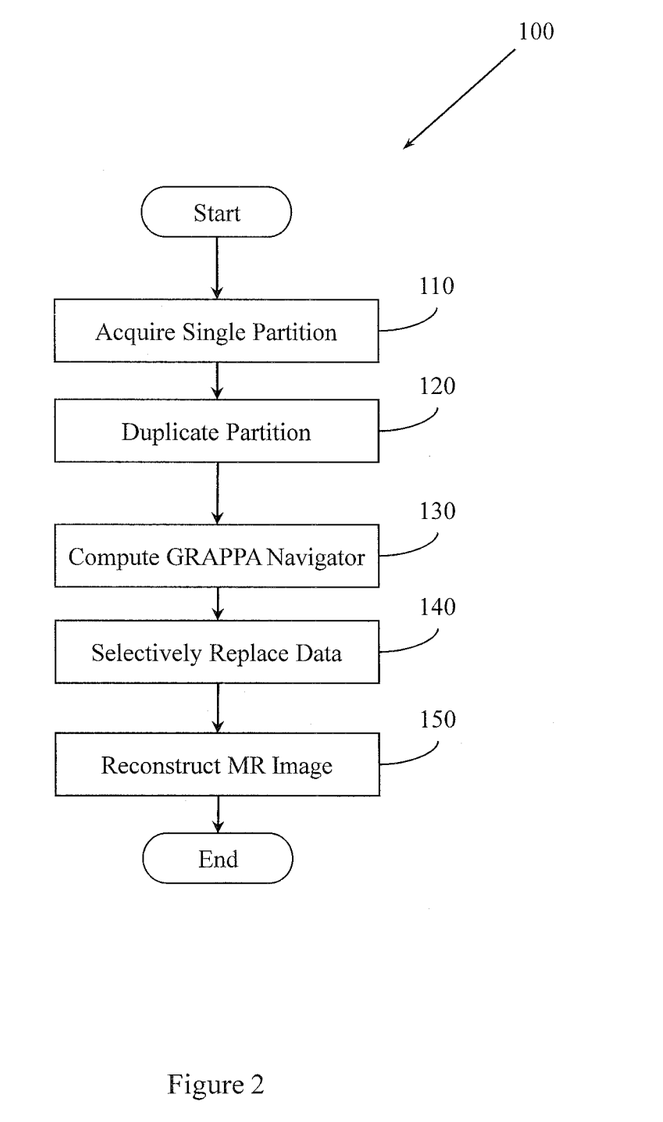
FIG. 2 illustrates an example method associated with motion artifact detection and removal.

FIG. 2 illustrates another embodiment of method 100. This embodiment of method 100 also includes, at 150, reconstructing an MR image. The MR image will be reconstructed using the data set and the single partition. If a PE line in the single partition had motion corrupted data replaced with zero signal data (e.g., zeroes), then the image reconstructed at 150 will likely be a lower resolution image than an image reconstructed from a complete, non-manipulated data set. However, if a PE line in the single partition had motion corrupted data replaced with zero signal data, then the image reconstructed at 150 will be less likely to exhibit a motion artifact. Medical personnel may prefer a lower resolution but less artifact impacted image to a higher resolution but more artifact impacted image. In one example, the medical personnel can produce both images. In another example, the medical personnel can control, based on the point at which motion was detected, how much motion corrupted data to replace and how much motion corrupted data, if any, to retain.

Figure 3:
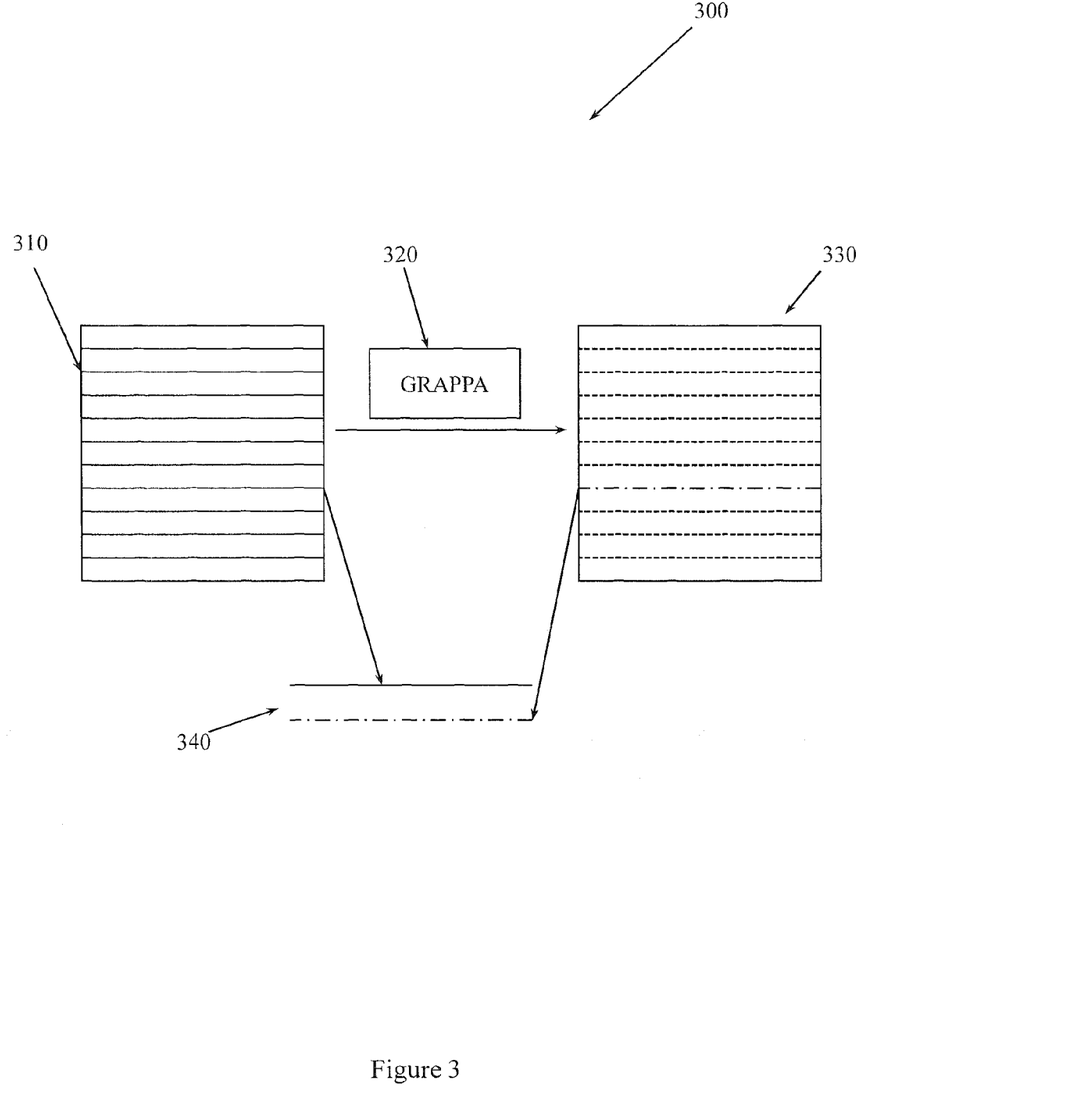
FIG. 3 illustrates an example data flow associated with motion artifact detection and removal.

FIG. 3 illustrates an example data flow 300 associated with motion artifact detection and removal. Data flow 300 includes a fully sampled VIBE single partition 310 that is duplicated by a GRAPPA logic 320 from a data set. The GRAPPA logic 320 produces a duplicate partition 330. Equivalent PE lines in partition 310 and duplicate partition 330 can then be compared at 340 to detect motion corrupted data. The comparison can produce correlation coefficients like those illustrated in FIG. 7. The correlation coefficients can then be analyzed by, for example, a step function (e.g., boxcar function) to identify motion corrupted data.

While figures one and three describe three dimensional data sets and illustrate replacing neighboring lines, one skilled in the art will appreciate that centric re-ordering may be applied in different ways using different techniques. One skilled in the art will also appreciate that centric re-ordering may be applied in two dimensional data sets.

In a two dimensional data set, the "partition" referred to above may more accurately be referred to as a slice. The "data set" would be a two dimensional data set. The centric reordering may proceed beginning at different locations. In one example, the centric reordering may begin at a point on a first (e.g., left) edge of a slice, may process a point above the point and a point below the point, and then proceed in this manner from left to right. In another example, the centric reordering may begin on a different (e.g., bottom) edge of a slice, may process a point to the left of the point and a point to the right of the point, and then proceed in this manner from bottom to top. The same effect could be achieved by rotating the slice. In yet another example, the centric reordering may be "elliptic centric", where the centric reordering begins at a point at or near the center of the slice and then proceeds in a non-Cartesian (e.g., spiral) pattern out from that point processing neighbors along the path traced by the non-Cartesian pattern.

A three dimensional data set can be considered to be a collection of two dimensional data sets. In a three dimensional data set, the data set representing the three dimensional volume may be referred to as the "data set" while a two dimensional slice may be referred to as the "partition". Centric reordering in a three dimensional data set may involve repetitively performing centric reordering in partitions (e.g., two dimensional data sets). Once again, the centric reordering may involve starting at an edge (e.g., left, bottom), processing neighbor points (e.g., above/below, left/right) and going from edge to edge. The centric reordering may also involve starting at a non-edge point and following a non-Cartesian path from the non-edge point to another point (e.g., edge point) while processing related (e.g., neighbor) points along the path.

Figure 4:
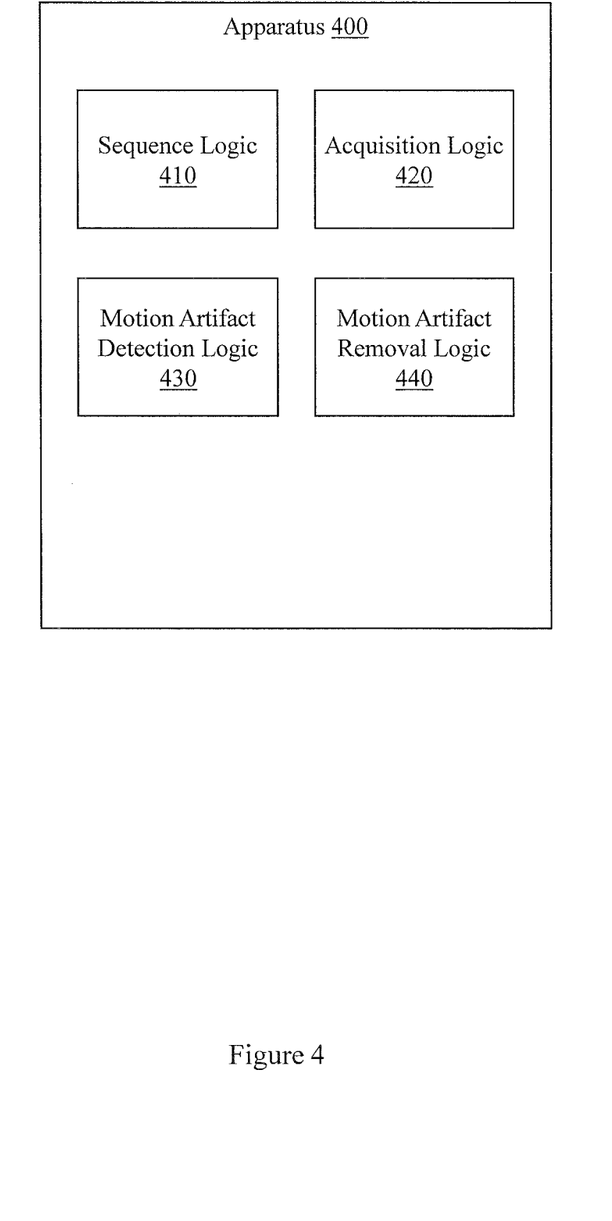
FIG. 4 illustrates an example system associated with motion artifact detection and removal.

FIG. 4 illustrates an apparatus 400. Apparatus 400 includes a sequence logic 410. Sequence logic 410 is configured to control an MRI apparatus to apply a Volumetric Interpolated Breath-hold Examination (VIBE) sequence to an object to be imaged. Sequence logic 410 may also be configured to apply other pulse sequences to an object to be imaged.

Apparatus 400 also includes an acquisition logic 420. Acquisition logic 420 is configured to acquire a multi-coil three-dimensional centric-ordered data set from the object to be imaged. The data set is produced in response to a pulse sequence (e.g., VIBE sequence) being applied to the object to be imaged. In one example, the acquisition logic 420 is configured to acquire the data set as a plurality of single partitions (e.g., slices defined by phase encoding steps in the slice direction). One skilled the art of MRI understands how signals are acquired from an object in response to a pulse sequence.

Apparatus 400 also includes a motion artifact detection logic 430. Motion artifact detection logic 430 is configured to detect motion corrupted data in the data set. In one example, the motion artifact detection logic 430 is configured to produce a plurality of GRAPPA duplicates corresponding to a plurality of single partitions (e.g., slices) acquired by the acquisition logic 420. In one example, the motion artifact detection logic 430 is configured to detect motion corrupted data in the data set by identifying a phase encoding line in a single partition in the plurality of partitions as being a phase encoding line that will produce a motion artifact. The motion artifact detection logic 430 may identify the phase encoding line by computing a correlation coefficient that describes a relationship between an actually acquired PE line and a corresponding GRAPPA duplicate PE line. If the two lines are similar to within a tolerance then the data associated with the actually acquired PE line is likely uncorrupted. If, however, the two lines are not similar to within a tolerance, then the data associated with the actually acquired PE line is likely corrupted. The motion artifact detection logic 430 may base the determination of whether a PE line is corrupted on whether the correlation coefficient satisfies a correlation threshold. FIG. 7 illustrates one example of examining correlation coefficients.

Apparatus 400 also includes a motion artifact removal logic 440. Motion artifact removal logic 440 is configured to manipulate the motion corrupted data in the data set. In one example, the motion artifact removal logic 440 is configured to selectively manipulate data associated with a PE line identified as having motion corrupted data. Manipulating data associated with the PE line can include, for example, replacing the data with zeroes. One skilled in the art will appreciate that other choices for replacement data may be employed.

Figure 5:
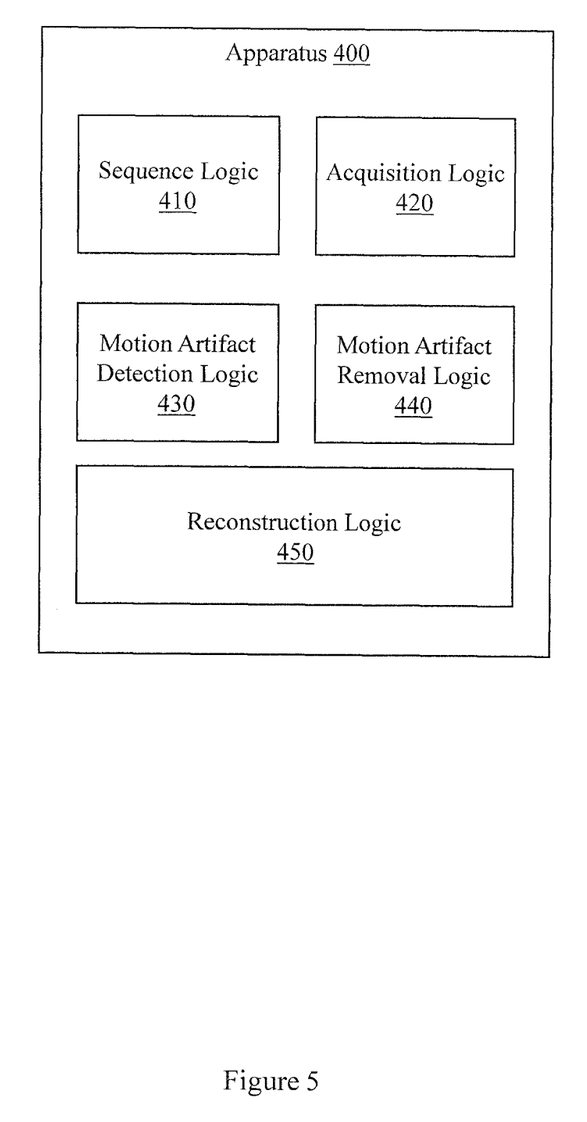
FIG. 5 illustrates an example system associated with motion artifact detection and removal.

FIG. 5 illustrates another embodiment of apparatus 400. This embodiment of apparatus 400 includes a reconstruction logic 450. Reconstruction logic 450 is configured to reconstruct an MR image from the data set acquired by the acquisition logic 420 and selectively manipulated by the motion artifact removal logic 440. An image reconstructed from a data set that includes all the data acquired by the acquisition logic 440 would have a higher resolution than an image reconstructed from a data set that was at least partially zeroed out by the motion artifact removal logic 440. However, the lower resolution image would have fewer, if any, motion artifacts.

Figure 6:
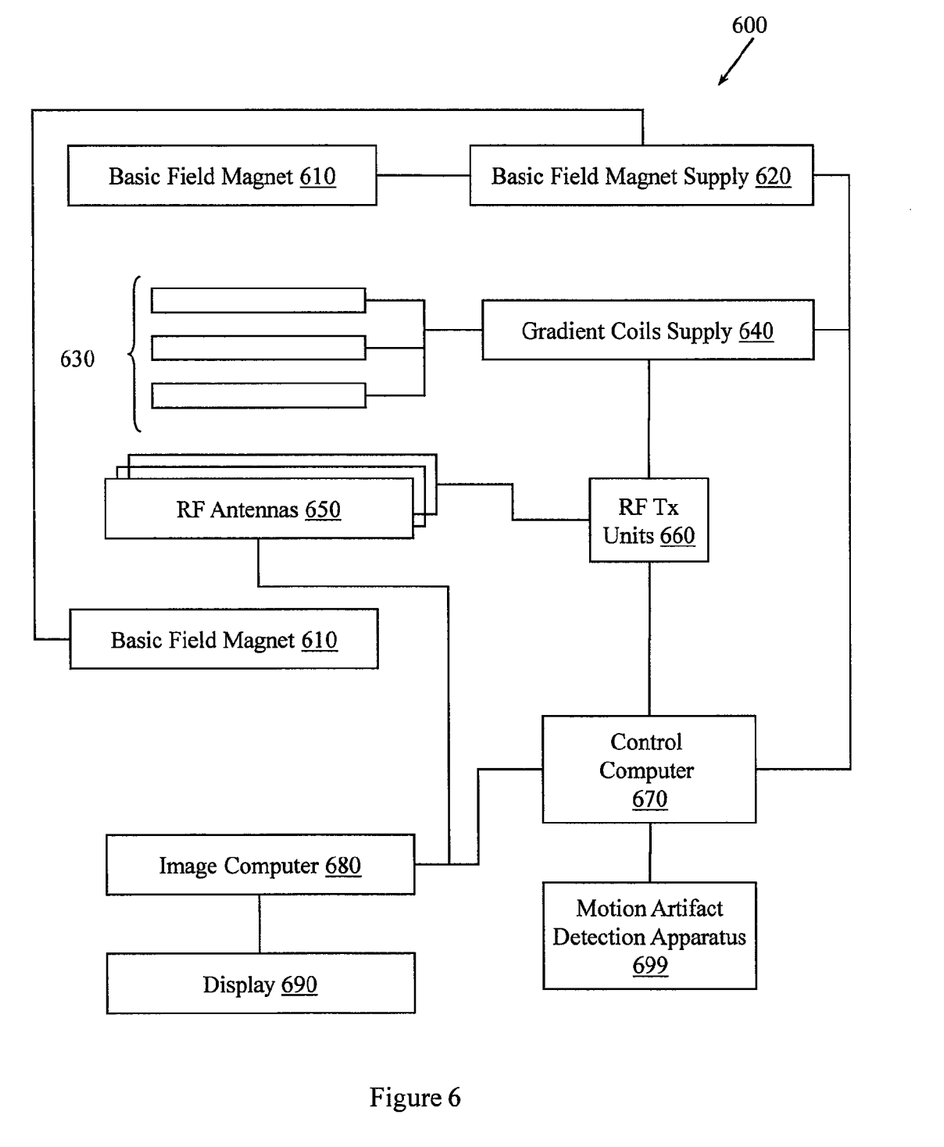
FIG. 6 illustrates an MRI apparatus associated with motion artifact detection and removal.

FIG. 6 illustrates an example MRI apparatus 600 configured with a motion artifact detection apparatus 699 to facilitate detecting motion artifacts and mitigating the effects of those motion artifacts in an MR image. The motion artifact detection apparatus 699 may be configured with elements of example apparatus described herein and/or may perform example methods described herein. The motion artifact detection apparatus 699 may include means (e.g., hardware, firmware, software in execution) for detecting data that produces a motion artifact in a magnetic resonance image. The motion artifact detection apparatus 699 may also include means (e.g., hardware, firmware, software in execution) for manipulating the data to mitigate production of the motion artifact in the magnetic resonance image.

The apparatus 600 includes a basic field magnet(s) 610 and a basic field magnet supply 620. Ideally, the basic field magnets 610 would produce a uniform $B_0$ field. However, in practice, the $B_0$ field may not be uniform, and may vary over an object being imaged by the MRI apparatus 600. MRI apparatus 600 may include gradient coils 630 configured to emit gradient magnetic fields like $G_S$, $G_P$ and $G_R$. The gradient coils 630 may be controlled, at least in part, by a gradient coils supply 640. In some examples, the timing, strength, and orientation of the gradient magnetic fields may be controlled, and thus selectively adapted during an MRI procedure.

MRI apparatus 600 may include a set of RF antennas 650 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 650 may be controlled, at least in part, by a set of RF transmission units 660. An RF transmission unit 660 may provide a signal to an RF antenna 650.

The gradient coils supply 640 and the RF transmission units 660 may be controlled, at least in part, by a control computer 670. In one example, the control computer 670 may be programmed to control an IMRI device as described herein. The magnetic resonance signals received from the RF antennas 650 can be employed to generate an image and thus may be subject to a transformation process like a two dimensional FFT that generates pixilated image data. The transformation can be performed by an image computer 680 or other similar processing device. The image data may then be shown on a display 690. While FIG. 6 illustrates an example MRI apparatus 600 that includes various components connected in various ways, it is to be appreciated that other MRI apparatus may include other components connected in other ways.

FIG. 7 illustrates an example plot 700 of correlation coefficients for PE lines for one partition and one coil. Plot 700 shows data for a single partition having 200 PE lines. In region 710 the correlation is less than a threshold (e.g., 0.8). In region 720 the correlation is greater than the threshold. In region 730 the correlation is once again less than the threshold. A step function can be fit to the plot 700 to identify that motion corrupted data exists beginning around PE line 80. A second step function can be fit to the plot 700 to identify that the motion corrupted data stops around PE line 130. In one example, data in PE lines 80-200 may be replaced with zero signal data. In another example, data in PE lines 80-130 may be replaced with zero signal data.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium storing computer-executable instructions that when executed by the computer cause the computer to perform a method, the method comprising:
    controlling a magnetic resonance imaging (MRI) apparatus to acquire a fully sampled, centric ordered, non-interleaved, data set from an object to be imaged;
    controlling a Generalized Auto-Calibrating Partially Parallel Acquisition (GRAPPA) logic to produce a GRAPPA duplicate of a single partition through the data set;
    computing, from the GRAPPA duplicate, a GRAPPA navigator for a phase encoding (PE) line in the single partition; and
    selectively replacing data in the PE line in the single partition with replacement data in response to determining that a comparison of the PE line in the single partition and a corresponding PE line in the GRAPPA duplicate indicates that data in the PE line has been motion corrupted, where the comparison is based, at least in part, on the GRAPPA navigator.

2. The computer-readable medium of claim 1, the method comprising reconstructing an MR image based, at least in part, on the data set.

3. The computer-readable medium of claim 1, the method comprising controlling the MRI apparatus to acquire a multi-coil three-dimensional data set, where the single partition is part of the multi-coil three-dimensional data set.

4. The computer-readable medium of claim 1, the method comprising controlling the MRI apparatus to apply a Volumetric Interpolated Breath-hold Examination (VIBE) sequence to the object to be imaged, and where the data set is acquired in response to the VIBE sequence.

5. The computer-readable medium of claim 1, where the replacement data is data corresponding to a zero signal from the object to be imaged.

6. The computer-readable medium of claim 1, where the replacement data is zeroes.

7. The computer-readable medium of claim 1, the method comprising selectively replacing additional data in additional PE lines in the data set.

8. The computer-readable medium of claim 3, the method comprising selectively replacing additional data in additional related partitions in the multi-coil three dimensional data set.

9. The computer-readable medium of claim 1, where comparing the PE line in the data set and the corresponding PE line in the GRAPPA duplicate comprises producing a correlation coefficient describing a correlation between the PE line in the data set and the corresponding PE line in the GRAPPA duplicate.

10. The computer-readable medium of claim 9, the method comprising fitting a step function to the correlation coefficients.

11. The computer-readable medium of claim 1, the method comprising:
  selectively terminating an MRI acquisition upon determining that the error exceeds a threshold.

12. The computer-readable medium of claim 1, where replacing data in the PE line in the data set with replacement data occurs on-the-fly during an MRI acquisition.

13. The computer-readable medium of claim 1, where replacing data in the PE line in the data set with replacement data occurs after an MRI acquisition is complete.

14. An apparatus, comprising:
  a sequence logic configured to control an MRI apparatus to apply a Volumetric Interpolated Breath-hold Examination (VIBE) sequence to an object to be imaged;
  an acquisition logic configured to acquire a multi-coil three-dimensional centric-ordered data set as a plurality of single partitions from the object to be imaged, where the data set is produced in response to the VIBE sequence being applied to the object to be imaged;
  a motion artifact detection logic configured to detect motion corrupted data in the data set and to produce a plurality of GRAPPA duplicates corresponding to the plurality of single partitions;
  a motion artifact removal logic configured to manipulate the motion corrupted data in the data set; and
  a reconstruction logic configured to reconstruct an MR image from the data set.

15. The apparatus of claim 14, where the motion artifact detection logic is configured to detect motion corrupted data in the data set by identifying a phase encoding line in a single partition in the plurality of partitions as being a phase encoding line that will produce a motion artifact.

16. The apparatus of claim 14, where the motion artifact detection logic is configured to identify the phase encoding line by computing a correlation coefficient by comparing the phase encoding line to a corresponding phase encoding line in a corresponding GRAPPA duplicate and by determining whether the correlation coefficient satisfies a correlation threshold.

17. The apparatus of claim 15, where the motion artifact removal logic is configured to selectively manipulate data associated with the PE line.

\* \* \* \* \*